(12) United States Patent
Lochner et al.

(10) Patent No.: US 7,001,479 B2
(45) Date of Patent: Feb. 21, 2006

(54) METHODS AND APPARATUS FOR ASSEMBLING MAGNETIZED PERMANENT MAGNETIC BLOCKS

(75) Inventors: Ronald Floyd Lochner, Florence, SC (US); Weijun Shen, Florence, SC (US); Geer Ward, Florence, SC (US); Bu-Xin Xu, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 391 days.

(21) Appl. No.: 10/406,431

(22) Filed: Apr. 3, 2003

(65) Prior Publication Data

US 2004/0194288 A1    Oct. 7, 2004

(51) Int. Cl.
*B32B 31/04*    (2006.01)
(52) U.S. Cl. ............... 156/297; 156/275.7; 29/607; 29/464; 29/466; 29/468

(58) Field of Classification Search .............. None
See application file for complete search history.

(56) References Cited

U.S. PATENT DOCUMENTS

| 5,668,516 | A | 9/1997 | Xu et al. |
| 5,999,076 | A | 12/1999 | Becker, Jr. et al. |
| 6,252,405 | B1 | 6/2001 | Watkins et al. |
| 6,358,582 | B1 | 3/2002 | Nagendra et al. |
| 6,504,461 | B1 | 1/2003 | Huang et al. |
| 6,828,891 | B1 * | 12/2004 | Jarvis et al. ............... 335/299 |
| 2002/0190827 | A1 | 12/2002 | Aoki et al. |

FOREIGN PATENT DOCUMENTS

EP    0978727 A2    2/2000

* cited by examiner

*Primary Examiner*—Jessica Rossi
(74) *Attorney, Agent, or Firm*—Carl B. Horton, Esq.; Armstrong Teasdale, LLP

(57) ABSTRACT

A method for bonding a plurality of magnetized blocks together includes providing at least two magnetized blocks, and bonding at least two magnetized blocks together using a door translatable in two orthogonal directions.

9 Claims, 6 Drawing Sheets

METHODS AND APPARATUS FOR ASSEMBLING MAGNETIZED PERMANENT MAGNETIC BLOCKS

BACKGROUND OF THE INVENTION

This invention relates to magnetic resonance image (MRI) imaging, and, more particularly, to methods and apparatus for assembling magnetized permanent magnetic blocks used for an MRI magnetic field generator.

A high uniform magnetic field is useful for using magnetic resonance image (MRI) and nuclear magnetic resonance (NMR) systems as a medical device or a chemical/biological device. At least some popular and low maintenance cost MRI systems currently available use a permanent magnet system that creates a middle range uniform field (0.2 to 0.5 Tesla) in a pre-determined space (imaging volume). A permanent magnet system usually uses multiple permanent magnet blocks such as NdFeB to form a single magnetic object (polepiece) and to achieve desire high uniform magnetic field in the imaging volume.

For a magnetic field generator for an MRI system that uses permanent magnets, the magnets used in such an apparatus are often formulated from a plurality of magnetized blocks. However, it is difficult to place un-magnetized material blocks on a yoke plate first and then magnetize each block. Therefore, in actual manufacturing, the blocks are fabricated and then magnetized. The magnetized blocks are then arranged on a yoke plate so that each of the magnet blocks has a same magnetic pole facing upward. A pole piece is then placed on the top of the magnetized blocks.

However, it is difficult to assemble permanent magnetic blocks together to form one single object for use on an MRI system with high uniformity and accuracy due to the nature of very large magnetic force acting upon with each other and with other magnetic objects (such as the pole piece). Obviously, the magnetic field uniformity for the assembled magnetic system is very much depended on the quality of assembled permanent magnetic blocks. Hence, the uniformity of magnetic block dimensions is important to the quality of the magnetic field, and thus to the quality of a magnetic field generator for an MRI device.

BRIEF DESCRIPTION OF THE INVENTION

In one aspect, a method for bonding a plurality of magnetized blocks together is provided. The method includes providing at least two magnetized blocks, and bonding at least two magnetized blocks together using a door translatable in two orthogonal directions.

In another aspect, a method for bonding a plurality of magnetized blocks together includes providing at least two magnetized blocks, and maintaining a first magnetized block in a first plane with at least four positioning members, each positioning member including at least one of a fixed positioning member and a moveable positioning member, maintaining a second magnetized block in a second plane parallel the first plane with at least four positioning members. The method also includes applying a bonding agent to at least one of a surface on the first magnetized block and an opposing surface on the second magnetized block, and pushing the second block along a thrust axis orthogonal to the first and second planes until the bonding agent contacts both the surface on the first magnetized block and the opposing surface on the second magnetized block.

In yet another aspect, a bonding apparatus is provided. The apparatus includes a body including a first positioning member and a second positioning member extending substantially perpendicular from the first positioning member, at least one movable positioning member coupled to the body and movable in a first direction to apply a force toward one of the first and second positioning members, and at least one ram extendable in a thrust direction orthogonal the first direction.

DETAILED DESCRIPTION OF THE INVENTION

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
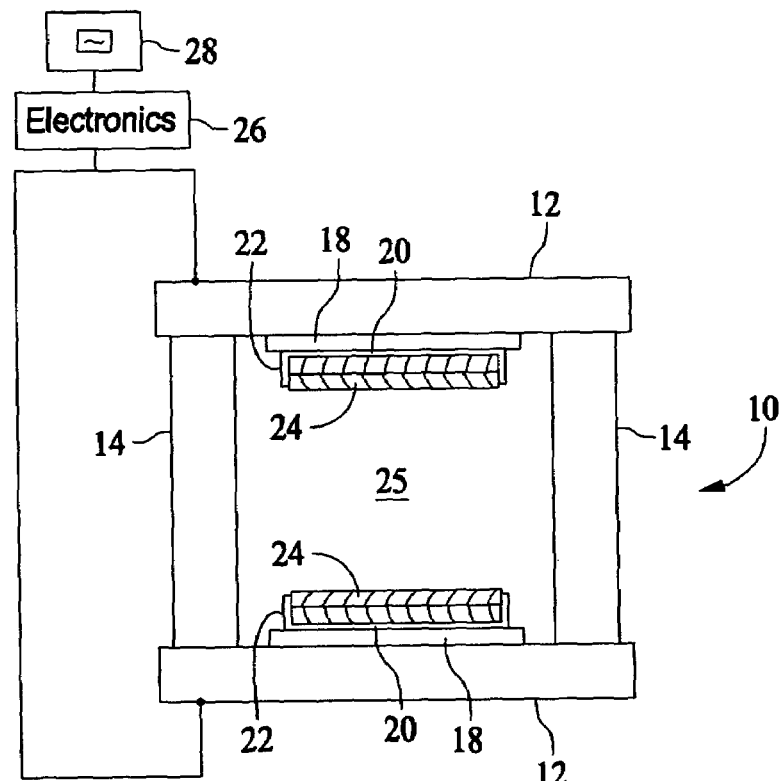
FIG. 1 is a block schematic diagram of an imaging system.
Figure 2:
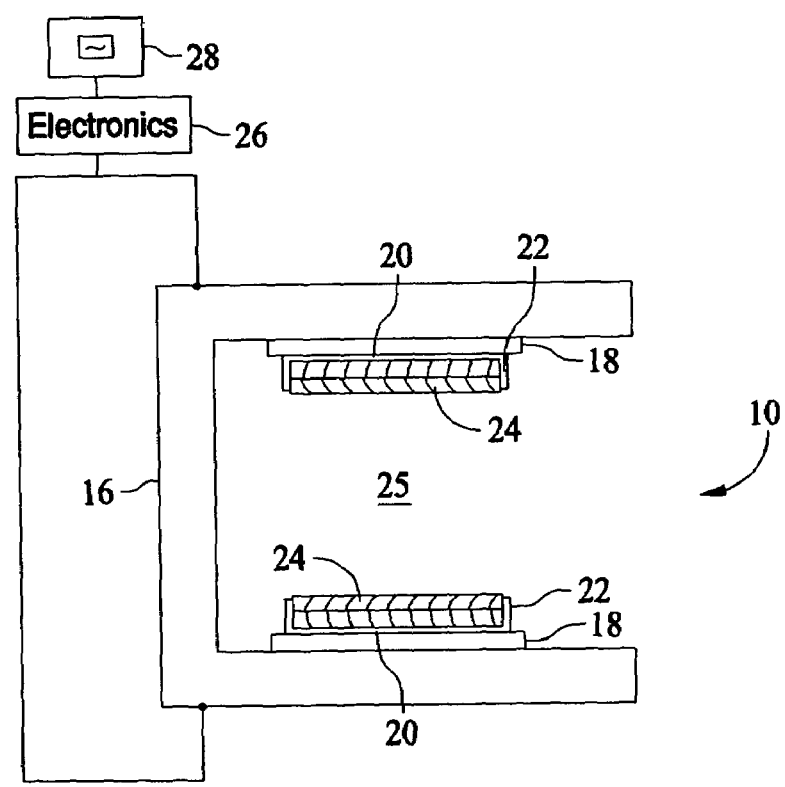
FIG. 2 is a block schematic diagram of an imaging system.

FIG. 1 is a block schematic diagram of an imaging system 10 such as an MRI system 10 including two plate yokes 12 and a plurality of columnar yokes 14 extending between plate yokes 12. Alternatively, an MRI system 10 with a single C shaped yoke 16 may be used as shown in FIG. 2. System 10 includes magnets 18 secured to yoke surfaces, pole piece bases 20 and support rings 22 secured to magnets 18 and a pole piece 24 is secured to each pole piece base 20 and support ring 22. A gap 25 is formed between pole pieces 24. A body part to be imaged is inserted into gap 25.

MRI system 10 also may contain electronics 26 and a display 28. Electronics 26 may include a control system such as a computer, a transmitter, a receiver, an imager, and/or a memory.

Figure 3:
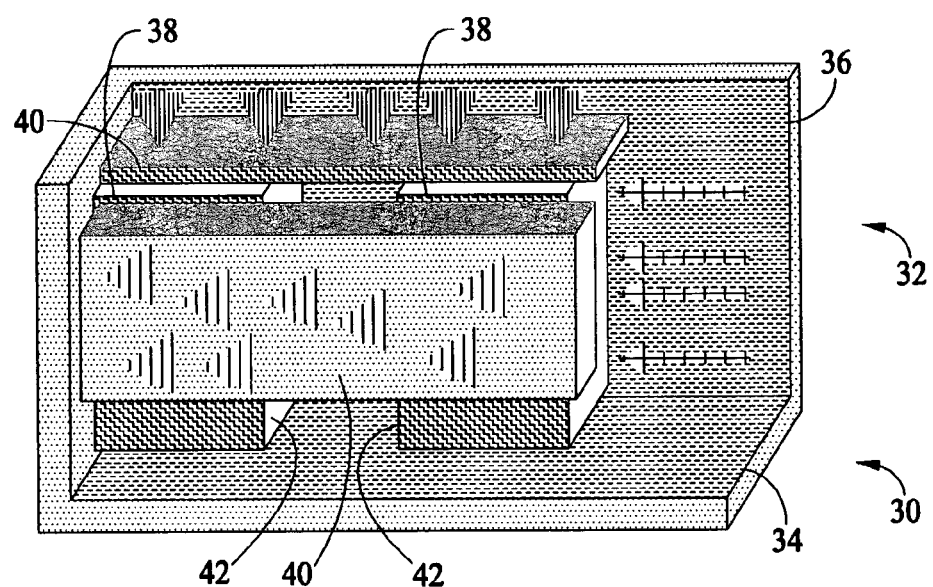
FIG. 3 illustrates an overview of a bonding apparatus.

FIG. 3 illustrates an overview of a bonding apparatus 30 including a body 32 including a first positioning member 34 and a second positioning member 36 extending perpendicular to first positioning member 34. A plurality of magnetized blocks 38 are positioned adjacent first and second positioning members 34 and 36. A plurality of force distribution members 40 are positioned adjacent blocks 38 opposite first and second positioning members 34 and 36.

In use, forces (illustrated as arrows) are applied to force distribution members 40 to position and maintain blocks 38 aligned together with each block 38 having a facing surface 42. A bonding agent (not shown) is applied to one of facing surfaces 42, and a thrust force (illustrated as arrows) is applied to push blocks 38 closer together until the bonding agent is in contact with both facing surfaces 42. Blocks 38 are thus maintained for a sufficient amount of time for the bonding agent to cure. Force distribution members 40 are removed and blocks 38 are removable as a single piece magnet member.

Figure 4:
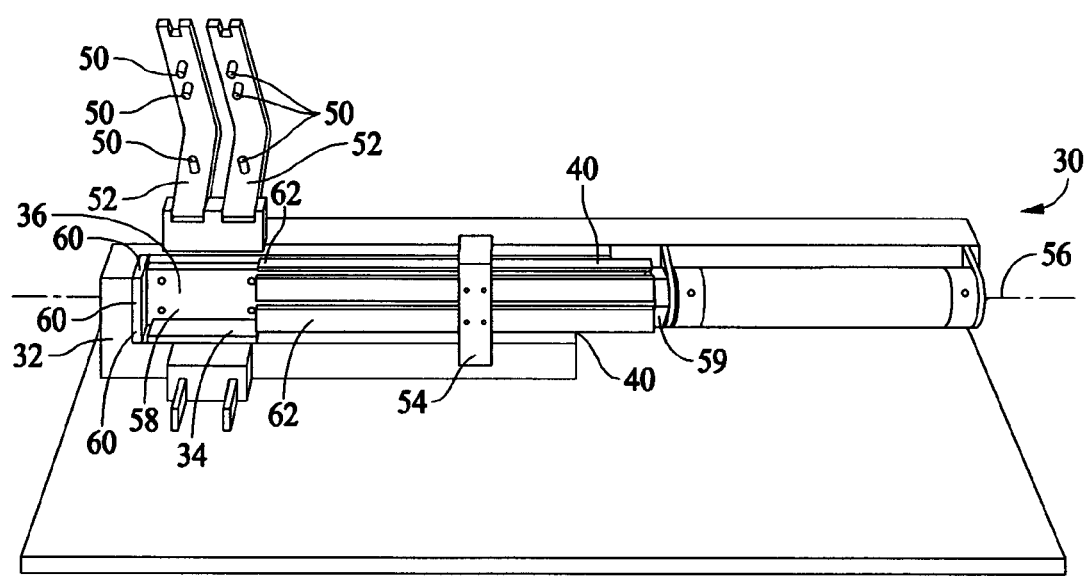
FIG. 4 is a detailed illustration of the bonding apparatus shown in FIG. 3.

FIG. 4 is a detailed illustration of bonding apparatus 30 (shown in FIG. 3) including a plurality of movable positioning members 50 rotatably coupled to body 32 via a support member 52. In an exemplary embodiment, support member 52 is hingedly coupled to body 32. Apparatus 30 also includes a door 54 coupled to body 32. Door 54 is translatable along a thrust axis 56 and when opened as illustrated in FIG. 4, there is an opening 58 sized to receive a magnetized block 38. A ram 59 is positioned to apply a force along thrust axis 56 as explained in greater detail below. Body 32 also includes a plurality of notches 60 sized to receive end portions 62 of force distribution members 40. In one embodiment, end portions 62 are chamfered to facilitate easy insertion into notches 60 by acting to guide end portions 62 into notches 60. In an exemplary embodiment, and as illustrated in FIG. 4, first positioning member 34 and second positioning member 36 are attached to body 32 as opposed to being integral with body 32 as illustrated in FIG. 3. In the exemplary embodiment, first and second positioning members 34 and 36 are also wear members in that they are fabricated from a material other than metal and are easily replaceable. In one embodiment, members 34 and 36 are fabricated from a polymer such as a phenolic resin.

Figure 5:
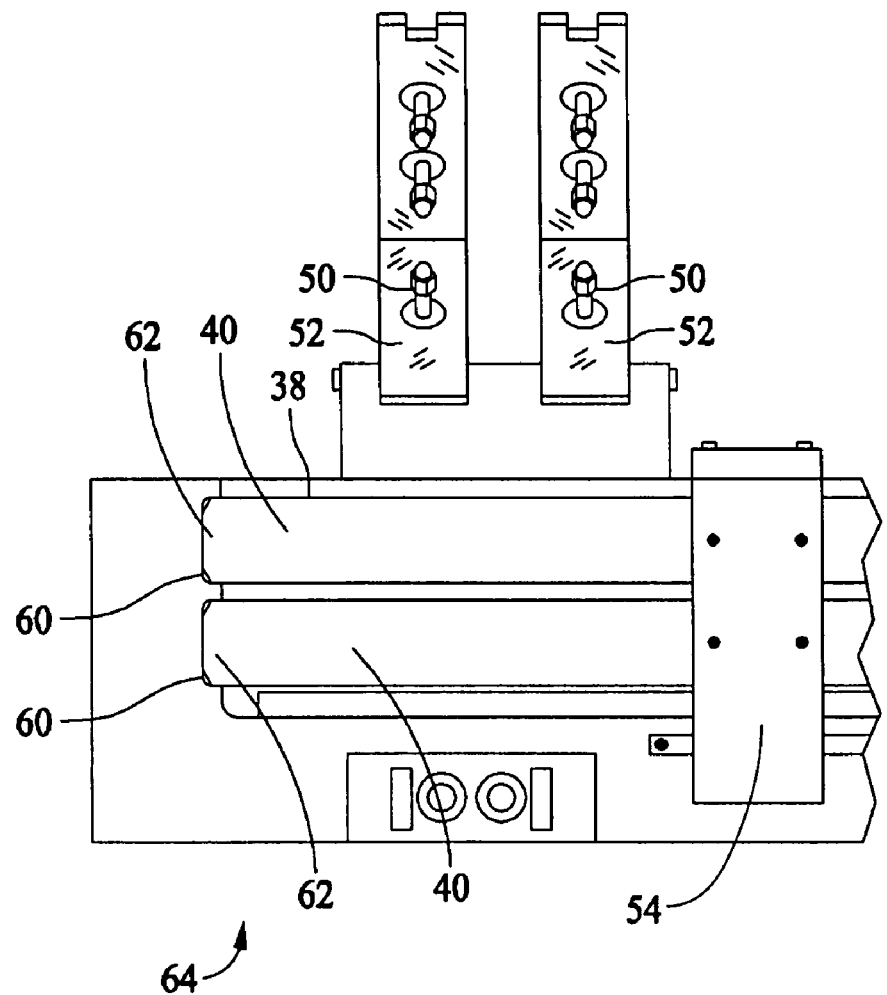
FIG. 5 illustrates the bonding apparatus shown in FIGS. 3 and 4 with a first magnetized block placed at a first end of a body and with a door in a closed position.
Figure 6:
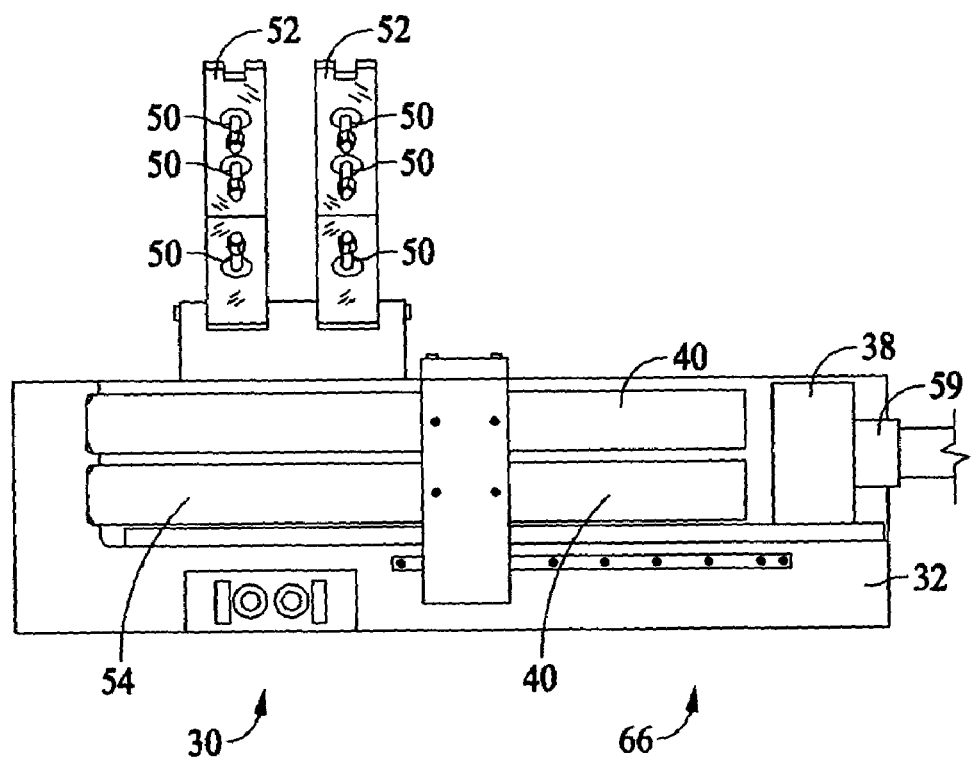
FIG. 6 illustrates the bonding apparatus shown in FIGS. 3 and 4 with a second magnetized block positioned at a second end of a body proximate a ram.

FIG. 5 illustrates bonding apparatus 30 with a first magnetized block 38 placed at a first end 64 of body 32 and with door 54 in a closed position. FIG. 6 illustrates bonding apparatus 30 with a second magnetized block 38 positioned at a second end 66 of body 32 proximate ram 59.

Figure 7:
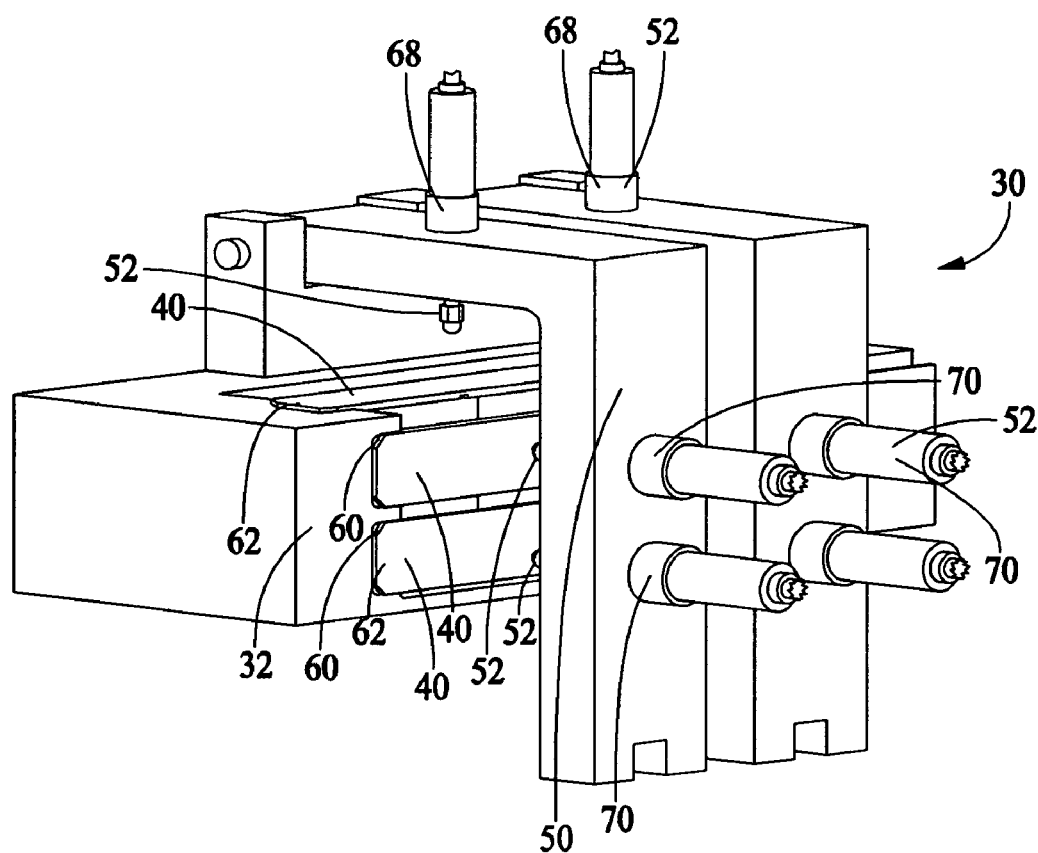
FIG. 7 illustrates the bonding apparatus with a plurality of movable positioning members positioned to exert a force against a plurality of magnetized blocks

FIG. 7 illustrates bonding apparatus 30 with movable positioning members 50 positioned to exert a force against blocks 38 such that blocks 38 are properly aligned for a bonding process. More particularly, a plurality of downwardly oriented movable positioning members 68 are positioned above force distribution member 40 to apply a downward force, and a plurality of sidewardly oriented movable positioning members 70 are positioned proximate a plurality of force distribution members 40 to apply a sideward force orthogonal to the downward force. First and second positioning members 34 and 36 are fixedly attached to body 32 (or integral with body 32), and are therefore also called fixed positioning members herein. A bonding agent is applied to at least one of a surface on first magnetized block 38 and an opposing surface on second magnetized block 38 (i.e., facing surfaces 42 as illustrated in FIG. 3) and ram 59 applies a force against second magnetized block 38 along thrust axis 56 (which is orthogonal to both the downward direction and the sideward direction) until the bonding agent contacts both surfaces. In an exemplary embodiment, the bonding agent is applied to both facing surfaces 42 on first magnetized block 38 and second magnetized block 38 and ram 59 applies a force along thrust axis 56 against second magnetized block 38 until the bonding agent contacts both surfaces. First and second blocks 38 are then maintained in their relative positions until the bonding agent has cured resulting in a single magnetic member. Accordingly, first magnetized block 38 is maintained in a plane defined by its facing surface 42, and second magnetized block 38 is maintained in a plane defined by its facing surface 42 which is parallel to the plane defined by facing surface 42 of first block 38, and then a force is applied along thrust axis 56 orthogonal to both planes to push second block 38 proximate first block 38. If desired, additional blocks can be added to create single magnetic members including three or more blocks. Additionally, and in one embodiment, door 54 includes two force distribution members 40 and is translatable in both the sideward direction and along thrust axis 56 which is orthogonal to the sideward direction, and facilitates easy insertion of first permanent magnetized block 38, easy alignment of second permanent magnetized block 38 with first permanent magnetized block 38, and easy removal of the resultant bonded single magnetic member after bonding.

In an exemplary embodiment, movable positioning members 50 and ram 59 are pneumatically actuated. In another embodiment, movable positioning members 50 and ram 59 are hydraulically actuated. Alternatively, movable positioning members 50 and ram 59 are actuated with gears or worm drives to apply the pressures (i.e., forces) herein described.

The herein described methods and apparatus provide a novel approach to assembling magnetized blocks to form large magnetized block assemblies for better magnetic objects that are useful for an MRI magnetic field generator. The herein described methods and apparatus also provide for a portable method and apparatus for assembling magnetized blocks to form large magnetized block assemblies.

Exemplary embodiments of methods and apparatus for assembling magnetized blocks to form large magnetized blocks are described above in detail. The methods and apparatus are not limited to the specific embodiments described herein, but rather, components of each method and apparatus may be utilized independently and separately from other components described herein. In addition, each method and apparatus component can also be used in combination with other components described herein.

While the invention has been described in terms of various specific embodiments, those skilled in the art will recognize that the invention can be practiced with modification within the spirit and scope of the claims.

What is claimed is:

1. A method for bonding a plurality of magnetized blocks together, said method comprising:
   providing at least two magnetized blocks; and
   bonding at least two magnetized blocks together using a door translatable in two orthogonal directions by:
   opening the door by translating the door along a thrust axis to form an opening in a fixture comprising the door;
   placing a first magnetized block through the opening in the fixture; and
   closing the door by translating the door along the thrust axis; and
   applying pressure on the first magnetized block by translating the door in a first direction orthogonal to the thrust axis.

2. A method in accordance with claim 1 wherein said bonding further comprises:
   placing a second magnetized block in the fixture;
   applying a bonding agent to at least one of a surface on the first magnetized block and an opposing surface on the second magnetized block; and
   pushing the second block along the thrust axis until the bonding agent contacts both the surface on the first magnetized block and the opposing surface on the second magnetized block.

3. A method in accordance with claim 2 further comprising applying a pressure to the first magnetized block and the second magnetized block in a direction orthogonal to both the thrust axis and the first direction.

4. A method in accordance with claim 3 wherein said applying a pressure comprises applying a force from a plurality of sources to a force distribution member in contact with both the first magnetized block and the second magnetized block.

5. A method for bonding a plurality of magnetized blocks together, said method comprising:
   providing at least two magnetized blocks;
   maintaining a first magnetized block in a first plane with at least four positioning members, each positioning member comprising at least two fixed positioning members and two moveable positioning members positioned opposing the fixed positioning members;
   maintaining a second magnetized block in a second plane parallel to the first plane with at least four positioning members;
   applying a bonding agent to at least one of a surface on the first magnetized block and an opposing surface on the second magnetized block; and
   pushing the second block along a thrust axis orthogonal to the first and second planes until the bonding agent contacts both the surface on the first magnetized block and the opposing surface on the second magnetized block.

6. A method in accordance with claim 5 wherein maintaining a second magnetized block comprises maintaining a second magnetized block in a second plane parallel the first plane with at least four positioning members including at least two fixed positioning members and two moveable positioning members positioned opposing the fixed positioning members.

7. A method in accordance with claim 6 further comprising positioning a first force distribution member in contact with both the first magnetized block and the second magnetized block in between one of the moveable positioning members and both the first magnetized block and the second magnetized block.

8. A method in accordance with claim 7 further comprising positioning a second force distribution member in contact with both the first magnetized block and the second magnetized block in between one of the moveable positioning members and one of the first magnetized block and the second magnetized block, said second force distribution member distributing a force in a direction orthogonal to a force distributed by the first force distribution member.

9. A method in accordance with 8 wherein said maintaining a first magnetized block comprises maintaining a first magnetized block in a first plane with at least five positioning members including at least two fixed positioning members and three moveable positioning members positioned opposing the fixed positioning members.

* * * * *